(12) United States Patent
Mattos (10) Patent No.: US 7,898,299 B2
(45) Date of Patent: Mar. 1, 2011

(54) CURRENT SENSE AMPLIFIER

(75) Inventor: Derwin W. Mattos, San Mateo, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 229 days.

(21) Appl. No.: 12/238,383

(22) Filed: Sep. 25, 2008

(65) Prior Publication Data

US 2010/0073090 A1  Mar. 25, 2010

(51) Int. Cl.
*G01R 19/00* (2006.01)

(52) U.S. Cl. ..................... 327/52; 324/123 C (58) Field of Classification Search ............. 327/51, 327/52, 60, 53, 54; 330/257, 258; 324/123 C
See application file for complete search history.

(56) References Cited

U.S. PATENT DOCUMENTS

| 6,133,712 A | * | 10/2000 | Yeon | 320/145 |
| 6,465,993 B1 | * | 10/2002 | Clarkin et al. | 323/272 |
| 6,621,259 B2 | * | 9/2003 | Jones et al. | 324/123 C |
| 7,015,728 B1 | * | 3/2006 | Solic | 327/51 |
| 7,459,894 B2 | * | 12/2008 | Li et al. | 323/285 |
| 7,683,604 B1 | * | 3/2010 | Steele et al. | 324/123 R |

* cited by examiner

*Primary Examiner*—Shawn Riley (57) ABSTRACT

A system includes a current sense amplifier to receive an input voltage based on a sense current provided to load circuitry. The current sense amplifier is configured to generate an output voltage from the input voltage based, at least in part, on one or more reconfigurable characteristics of the current sense amplifier. The system also includes a microcontroller to compare the output voltage from the current sense amplifier to one or more programmable thresholds. The microcontroller is configured to direct a current controller to regulate the sense current provided to the load circuitry according to the comparison.

20 Claims, 6 Drawing Sheets

CURRENT SENSE AMPLIFIER

TECHNICAL FIELD

This disclosure relates generally to electronic circuits, and more particularly to current sense amplifiers.

BACKGROUND

Many electronic systems include load circuitry that requires a regulated flow of current to operate properly. In order to control the current flow to the load circuitry, these electronic systems typically also include a current measurement device to measure the current flow to the load circuitry and a current control device to control or regulate current flow to the load circuitry. Thus, the current measurement device measures the current being provided to the load circuitry, the measurement is fed back to the current control device for adjustment of the current being provided to the load circuitry.

High-side current sense amplifiers are one common type of current measurement device utilized by the electronic systems. These high-side current sense amplifiers typically operate to sense a voltage difference across a high-side sense resistor that is coupled with a load circuitry. High-side current sense amplifiers can be constructed or configured to trade-off various performance options, such as gain accuracy and operating frequency or bandwidth.

SUMMARY

According to an embodiment, a system includes a current sense amplifier to receive an input voltage based on a sense current provided to load circuitry for operation. The current sense amplifier is configured to generate an output voltage from the input voltage based, at least in part, on one or more reconfigurable characteristics of the current sense amplifier. The system also includes a microcontroller to compare the output voltage from the current sense amplifier to one or more programmable thresholds. The microcontroller is configured to direct a current controller to regulate the sense current provided to the load circuitry according to the comparison.

According to an embodiment, a method comprising receiving an input voltage based on a sense current provided to load circuitry for operation, generating an output voltage from the input voltage based, at least in part, on one or more reconfigurable characteristics of a current sense amplifier, comparing the output voltage from the current sense amplifier to one or more programmable thresholds, and regulating the sense current provided to the load circuitry according to the comparing.

According to an embodiment, an apparatus comprising a first amplification circuit to receive an input voltage that corresponds to a current flowing through a sense resistor to load circuitry. The first amplification circuit is configured to amplify the input voltage according to one or more adjustable characteristics that are configurable by a microcontroller. The apparatus further comprising a second amplification circuit to generate an output voltage by amplifying the input voltage from the first amplification circuit according to one or more adjustable characteristics that are configurable by the microcontroller. The microcontroller utilizes the output voltage to regulate current provided to the load circuitry.

DESCRIPTION OF THE DRAWINGS

The invention may be best understood by reading the disclosure with reference to the drawings.

DETAILED DESCRIPTION

A programmable system on a chip (PSOC) or other electronic system can control the operation of various load circuits, such as light-emitting diode (LED) arrays or other current-driven circuits. Since these load circuits often have differing operational requirements, such as gain accuracy and operating frequency or bandwidth tradeoffs, the programmable system on a chip includes at least one reconfigurable current sense amplifier to ensure the programmable system on a chip can accommodate the various load circuits. Embodiments are shown and described below in greater detail.

Figure 1:
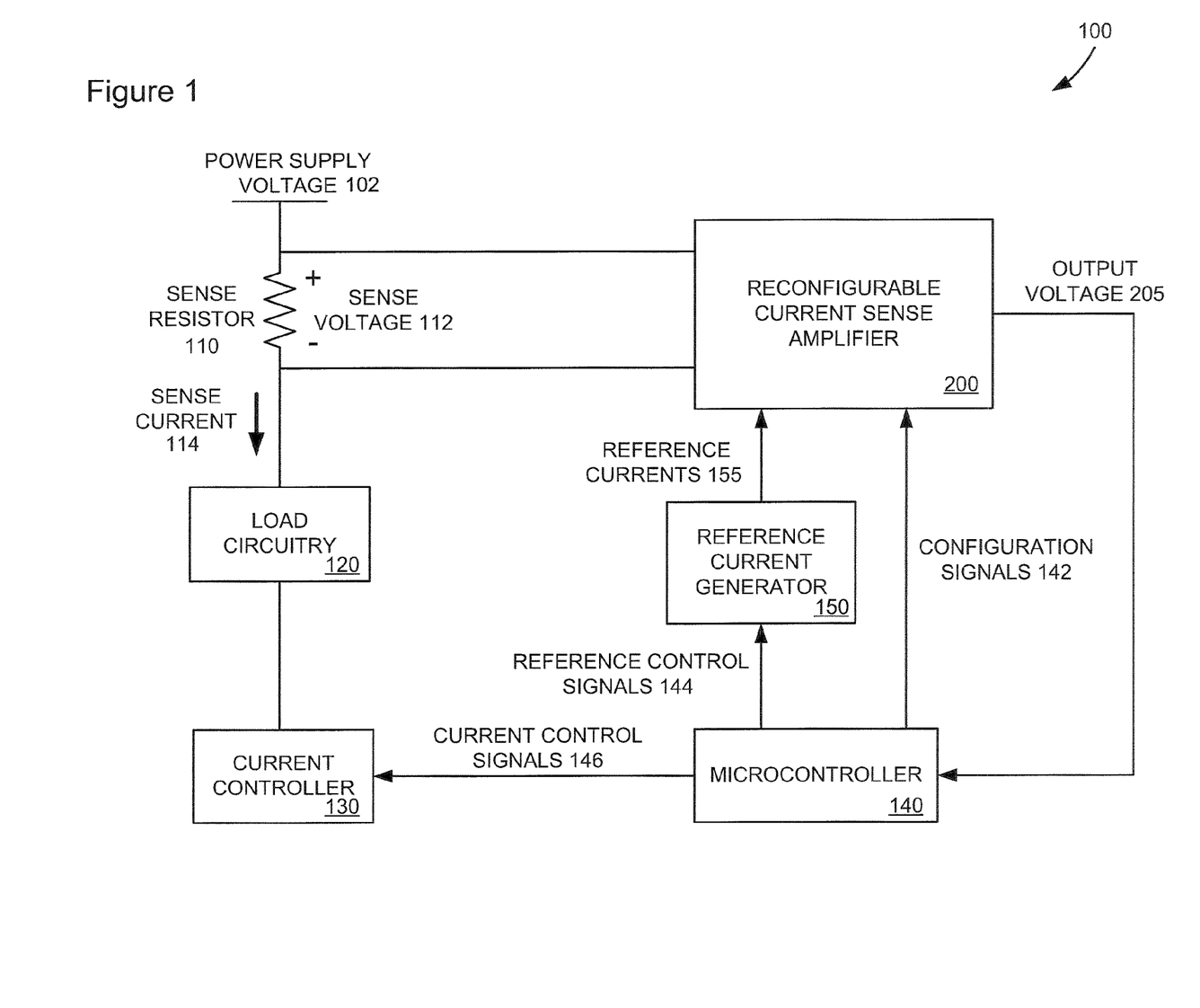
FIG. 1 is a block diagram of an example electronic system including a reconfigurable current sense amplifier according to embodiments of the invention.

FIG. 1 is a block diagram of an example electronic system 100 including a reconfigurable current sense amplifier 200 according to embodiments of the invention. Referring to FIG. 1, the electronic system 100 generates and regulates a sense current 114 that powers load circuitry 120. The load circuitry 120 can be any current-driven device, such as a light-emitting diode (LED) array, control circuitry, or other load device that includes inductive and/or resistive electronic components. Although FIG. 1 shows the load circuitry 120 as forming a part of the electronic system 100, in some embodiments, the load circuitry 120 can be located externally to the electronic system 100.

The electronic system 100 includes a sense resistor 110 coupled in series with the load circuitry 120. The sense resistor 110 can receive a power supply voltage 102 and induce the sense current 114 to be provided to the load circuitry 120. The electronic system 100 includes a current controller 130 to adjust the magnitude of the sense current 114 that is driven through a sense resistor 110. In some embodiments, the current controller 130 includes a field effect transistor (FET), such as an N-type FET or other device that can regulate or control current flow through the load circuitry 120. Thus, the combination of the sense resistor 110 and the current controller 130 can dictate the magnitude of the sense current 114 provided to the load circuitry 120.

The electronic system 100 includes a reconfigurable current sense amplifier 200 to detect a sense voltage 112 or input voltage across the sense resistor 110. The sense voltage 112 corresponds to the magnitude of sense current 114 generated by the current controller 130, the sense resistor 110, and the power supply voltage 102. In some embodiments, the reconfigurable current sense amplifier 200 can receive the sense voltage 112 as a pair of inputs, one corresponding to the node of the sense resistor 110 coupled to the power supply voltage 102 and the other corresponding to the node of the sense resistor 110 coupled to the load circuitry 120.

The reconfigurable current sense amplifier 200 can amplify the sense voltage 112 to generate an output voltage 205 according to one or more adjustable characteristics. For instance, the reconfigurable current sense amplifier 200 has an adjustable amplification gain, an adjustable input offset, and adjustable bandwidth compensation. Embodiments of the reconfigurable current sense amplifier 200 and these adjustable characteristics will be described below in greater detail.

The electronic system 100 includes a microcontroller 140 to control operations in the electronic system 100. The microcontroller 140 can be a processor, microprocessor, or other controlling device, and in some embodiments, can be implemented in firmware or as a discrete set of hardware elements. Although not shown in FIG. 1, the microcontroller 140 can be coupled to a computer or machine readable medium or other memory device that includes instructions, when executed by the microcontroller 140, can cause the microcontroller 124 to perform various functions or operations.

The microcontroller 140 can receive the output voltage 205 from the reconfigurable current sense amplifier 200 and generate current control signals 146 for transmission to the current controller 130 responsive to the output voltage 205. The current control signals 146 can activate or deactivate the current controller 130 to drive the sense current 114. In some embodiments, the microcontroller 140 can compare the output voltage 205 to one or more programmable thresholds to determine which current control signals 146 to provide to the current controller 130.

The microcontroller 140 can generate configuration signals 142, which direct configuration of adjustable characteristics in the reconfigurable current sense amplifier 200. In some embodiments, the reconfigurable current sense amplifier 200 can have register electronically trimmable components that are reconfigured according to the configuration signals 142.

The electronic system 100 includes a reference current generator 150 to provide reference currents 155 to the reconfigurable current sense amplifier 200, e.g., in response to reference controller signals 144 from the microcontroller 150. These reference currents 155 can be used to help power the reconfigurable current sense amplifier 200, as will be shown and described below in greater detail.

Figure 2:
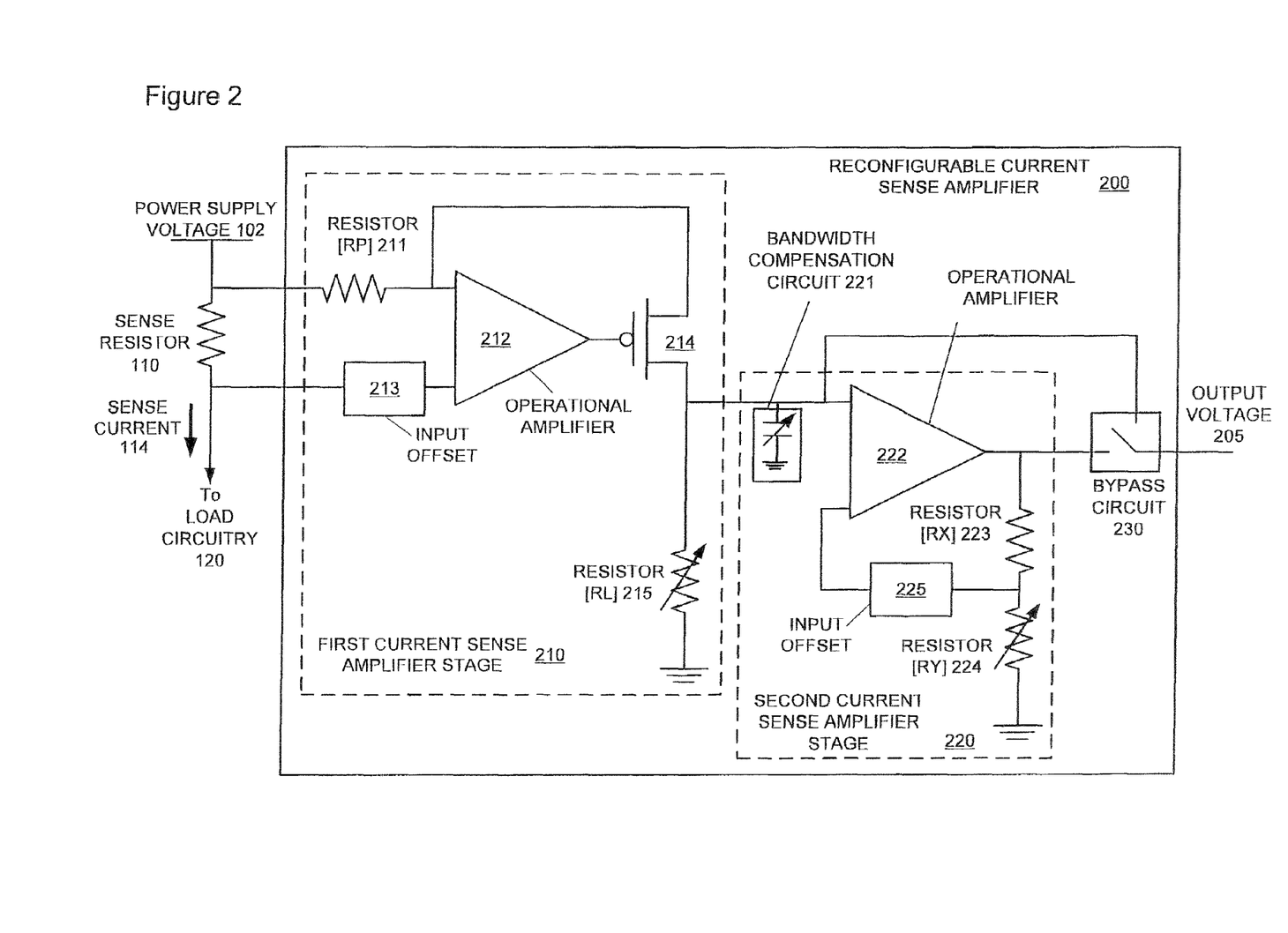
FIG. 2 is a block diagram of an example reconfigurable current sense amplifier according to embodiments of the invention.

FIG. 2 is a block diagram of an example reconfigurable current sense amplifier 200 according to embodiments of the invention. Referring to FIG. 2, the reconfigurable current sense amplifier 200 can include multiple stages, such as a first current sense amplifier stage 210 and a second current sense amplifier state 220. The first current sense amplifier stage 210 is coupled to the sense resistor 110 to receive the sense voltage 112, for example, on a pair of input lines. In some embodiments, the first current sense amplifier stage 210 receives two voltage inputs from the sense resistor 110, where the voltage difference between the two voltage inputs is the sense voltage 112.

The first current sense amplifier stage 210 can include a first resistor RP 211 coupled between a higher voltage side of the sense resistor 110 and an operational amplifier 212. The lower voltage side of the sense resistor 110 can be coupled to another terminal of the operational amplifier 212. In some embodiments, an adjustable input offset 213 can be coupled between the lower voltage side of the sense resistor 110 and the other terminal of the operational amplifier 212.

The first current sense amplifier stage 210 can include a transistor 214, such as a PMOS transistor, that when activated by an output of the operational amplifier 212, generate a stage one output. The first current sense amplifier stage 210 also include a variable resistor RL 215 that is coupled to the stage one output and a ground.

The configuration of the first current sense amplifier stage 210 allows the sense voltage 112 detected across the sense resistor 110 to be amplified according to Equation 1.

$$V_{StageOneOut} = \frac{R_L}{R_P} V_{Sense} \qquad \text{Equation 1}$$

Thus, the first current sense amplifier stage 210 amplifies the sense voltage 112 input into the system according a ratio between the two resistors, RP 211 and RL 213, in the first current sense amplifier stage 210.

In some embodiments, the microcontroller 140 can provide configuration signals 142 to the reconfigurable current sense amplifier 200 that adjust the stage one output. For instance, the configuration signals 142 can adjust the resistance value of the variable resistor RL 215, which may directly modify the amplification of the sense voltage 112, as the resistance ratio shown in Equation 1 may change. The configuration signals 142 can also adjust the input offset 213 to alter the difference between the input voltages that are provided to the operational amplifier 212, thus effectively changing the value of the sense voltage 112 that is amplified by the first current sense amplifier stage 210.

The second current sense amplifier stage 220 includes an operational amplifier 222 that receives the stage one output at one terminal. The output of the operational amplifier 222 is coupled to multiple resistors, RX 223 and RY 224, arranged in series. A node between the two resistors RX 223 and RY 224 is coupled as a feedback to the other terminal of the operational amplifier 222. In some embodiments, an input offset 225 can be coupled between the node between the two resistors RX 223 and RY 224 and the other terminal of the operational amplifier 222.

The configuration of the second current sense amplifier stage 220 allows the stage one output to be amplified according to Equation 2.

$$V_{Output} = \left(1 + \frac{R_X}{R_Y}\right) V_{StageOneOut} \qquad \text{Equation 2}$$

Thus, the second current sense amplifier stage 220 amplifies the stage one output according a ratio between the two resistors, RX 223 and RY 224, in the second current sense amplifier stage 210. In some embodiments, the microcontroller 140 can provide configuration signals 142 to the reconfigurable current sense amplifier 200 that adjust the characteristics of the second current sense amplifier stage 220 to vary the output voltage 205. For instance, the configuration signals 142 can adjust the resistance value of the variable resistor RY 2234 which may directly modify the amplification of the stage one output, as the resistance ratio shown in Equation 2 may change. The configuration signals 142 can also adjust the input offset 225 to alter the difference between the input voltages that are provided to the operational amplifier 222.

Thus, the output voltage 205 of the reconfigurable current sense amplifier 200 can be expressed according to Equation 3.

$$V_{Output} = \left(1 + \frac{R_X}{R_Y}\right)\left(\frac{R_L}{R_P}\right)V_{Sense} \qquad \text{Equation 3}$$

The second current sense amplifier stage 220 can also include a bandwidth compensation circuit 221 that is coupled between the stage one output and the operational amplifier 222. The bandwidth compensation circuit 221 can dampen the effect of noise in the power supply voltage 102 that is amplified in the first current sense amplification stage 210. By dampening the noise in the power supply voltage, the reconfigurable current sense amplifier 200 can optimize a Power Supply Rejection Ratio (PSRR) and limit subsequent swings in the sense current 114 due to the power supply noise. In some embodiments, the bandwidth compensation circuit 221 can include a variable capacitor, for example, that is adjustable according to the configuration signals 142 from the micro controller 140.

The reconfigurable current sense amplifier 200 can include a bypass circuit 230 that can optionally bypass the second current sense amplifier stage 220. In some embodiments, the configuration signals 142 from the microcontroller 140 can control the operation of the bypass circuit 230. Thus, when the bypass circuit 230 is activated to bypass the second current sense amplifier stage 220, the stage one output becomes the output voltage 205. In some embodiments, the bypass circuit 230 can be activated to bypass the second current sense amplifier stage 220 during lower frequency operation of the electronic system, while during higher frequency operation the bypass circuit 230 can be set to have the second stage output become the output voltage 205.

Figure 3A:
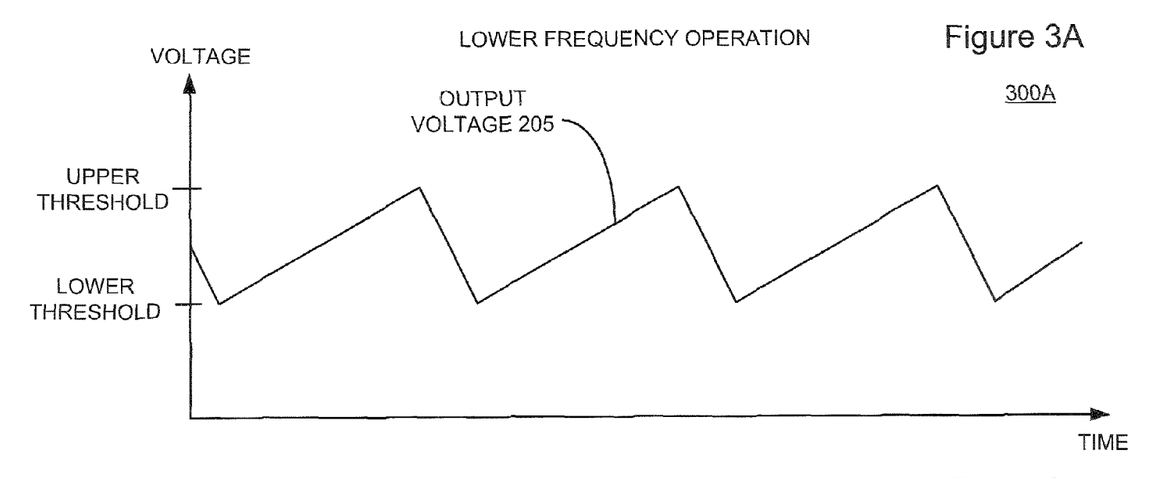
FIGS. 3A-3B are diagrams illustrating operational embodiments of electronic system and the reconfigurable current sense amplifier shown in FIGS. 1 and 2.
Figure 3B:
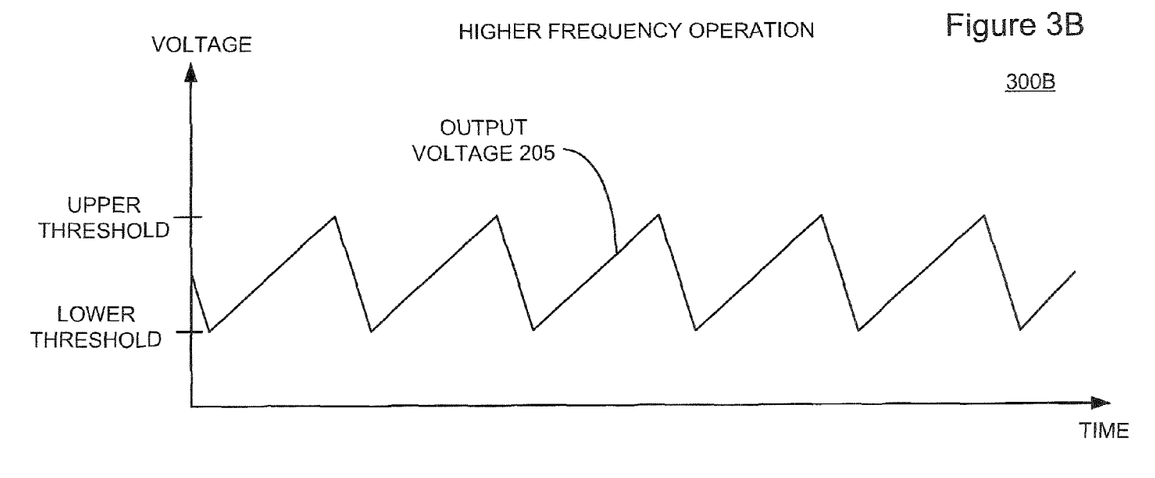

FIGS. 3A-3B are diagrams illustrating operational embodiments of electronic system 100 and the reconfigurable current sense amplifier 200 shown in FIGS. 1 and 2. Referring to FIGS. 3A and 3B, the diagram 300A discloses a lower frequency operation for the electronic system 100, and diagram 300B discloses a higher frequency operation for the electronic system 100. As discussed above, in FIGS. 1 and 2, the microcontroller 140 directs the current controller 130 to activate and deactivate based, at least in part, on the output voltage 205 received from the reconfigurable current sense amplifier 200. The microcontroller 140 compares the output voltage 205 to one or more thresholds, for example, an upper threshold and a lower threshold, to determine when to activate or deactivate the current controller 130.

When the current controller 130 is activated, for example, responsive to current control signals 146 from the microcontroller 140, the sense current 114 (and corresponding sense voltage 112 and output voltage 205) increases over time. The microcontroller 140 can compare the output voltage 205 to the upper threshold to determine when to direct the current controller 130 to deactivate. When the current controller 130 is deactivated, for example, responsive to current control signals 146 from the microcontroller 140, the sense current 114 (and corresponding sense voltage 112 and output voltage 205) decreases over time. The microcontroller 140 can compare the output voltage 205 to the lower threshold to determine when to direct the current controller 130 to activate again. The activation and deactivation of the current controller 130 generates an oscillation of the sense current 114, sense voltage 112, and the output voltage 205, which is known as the operational frequency of the electronic system 100.

The operational frequency of the electronic system 100 can be modified by the microcontroller 140 by adjusting the thresholds and/or by reconfiguring the current sense amplifier 200. For instance, when the thresholds are positioned closer together, less time can required before the current controller 130 is activated or deactivated, thus increasing the operational frequency. Similarly, when the thresholds are positioned farther apart, more time can required before the current controller 130 is activated or deactivated, thus increasing the operational frequency.

Reconfiguring the current sense amplifier 200 to adjust the gain can also modify the operational frequency of the electronic system 100. Since the slope of the output voltage 205, when the current controller 130 is activated, is at least in part dictated by the gain of the reconfigurable current sense amplifier 200, any change in slope can also prompt activation or deactivation of the current controller 130. As shown, in FIG. 3B, the gain of the reconfigurable current sense amplifier 200 was increased, which also increased the positive slope of the output voltage 205 over time, and thus increased the operational frequency of the electronic system 100.

Other adjustments to the reconfigurable current sense amplifier 200, such as modifying the input offsets 213 and 225 into the operational amplifiers 212 and 222, respectively, activating the bandwidth compensation circuit 221, and/or bypassing the second current sense amplifier stage 220, can also affect the waveforms illustrated in FIGS. 3A and 3B. For instance, adjustment to the input offset can alter the DC level of the waveform by raising or lowering the waveform along the Y-axis. Input offset adjustment can also alter the duty cycle of the waveform, allowing system designers or programmers to maximize power efficiency by limiting the time that the current controller 130 is activated.

Figure 4:
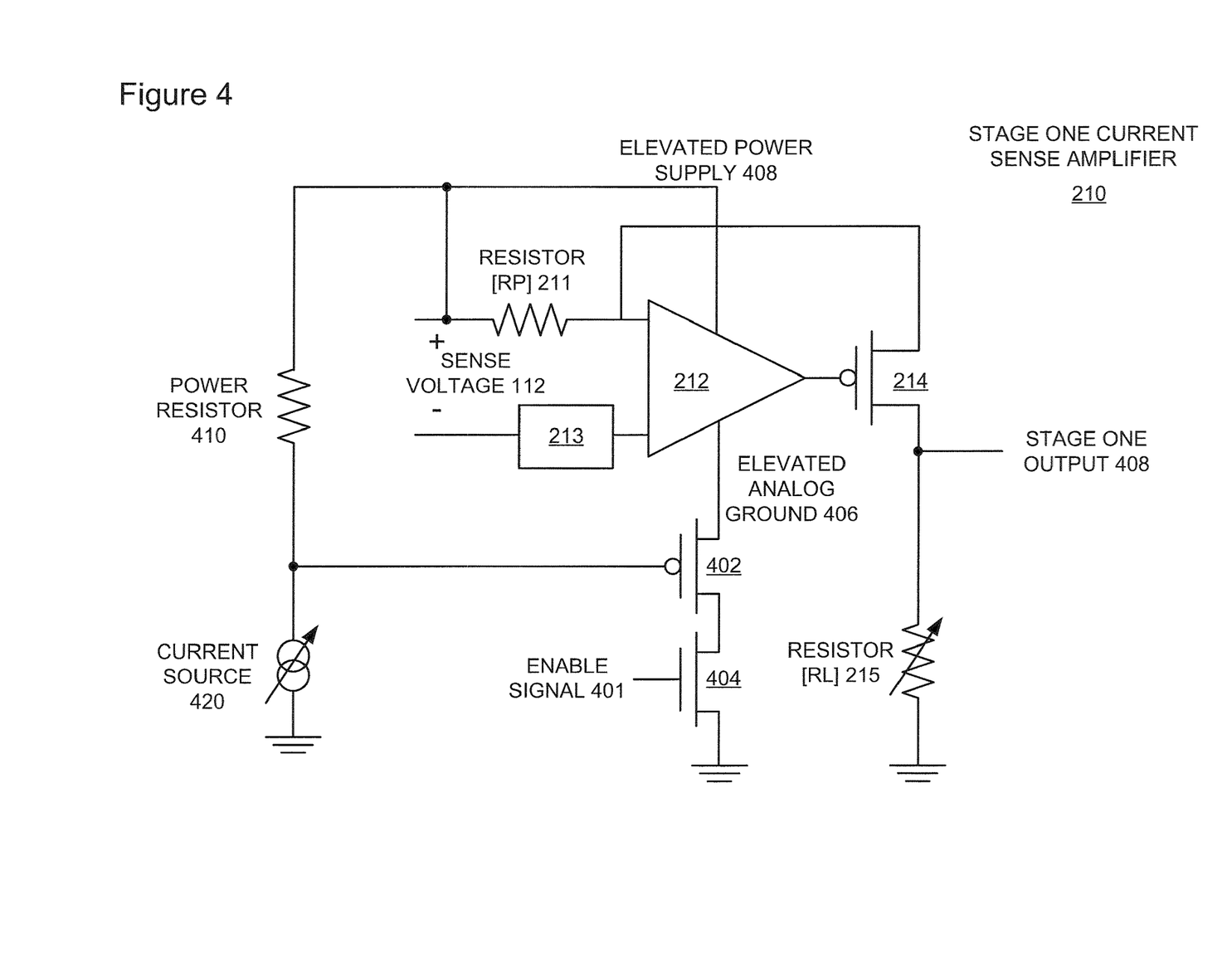
FIG. 4 is a block diagram of an example reconfigurable current sense amplifier with self powering functionality according to embodiments of the invention.

FIG. 4 is a block diagram of an example reconfigurable current sense amplifier 200 with self powering functionality according to embodiments of the invention. Referring to FIG. 4, the reconfigurable current sense amplifier 200 can include circuitry that powers the operational amplifiers 212 and 222 from the high node of the sense voltage 112, i.e., utilizes the high node of the sense voltage 112 as an elevated power supply 408 and generates an elevated analog ground 406 from the elevated power supply 408.

The reconfigurable current sense amplifier 200 includes a power resistor 410 that is coupled to receive the elevated power supply 408. A current source 420 can draw current through the power resistor 410 to induce a voltage drop across the power resistor 410. In some embodiments, a voltage drop across the power resistor 410 is approximately equal to 6V. This voltage drop lowers the voltage level of the elevated power supply for use as an elevated analog ground 406.

The reconfigurable current sense amplifier 200 includes a first transistor 402 to generate the elevated analog ground 406 responsive to receiving the elevated power supply with the voltage drop at its gate region. In some embodiments, the first transistor 402 can be a PMOS transistor. The reconfigurable current sense amplifier 200 includes a second transistor 404 can be coupled between the first transistor 402 and a ground, with its gate region configured to receive an enable signal 401. In some embodiments, the second transistor 404 can be a NMOS transistor. When the enable signal 201 is activated, the first transistor 402 can provide the elevated analog ground 406 to the operational amplifier 212.

Figure 5:
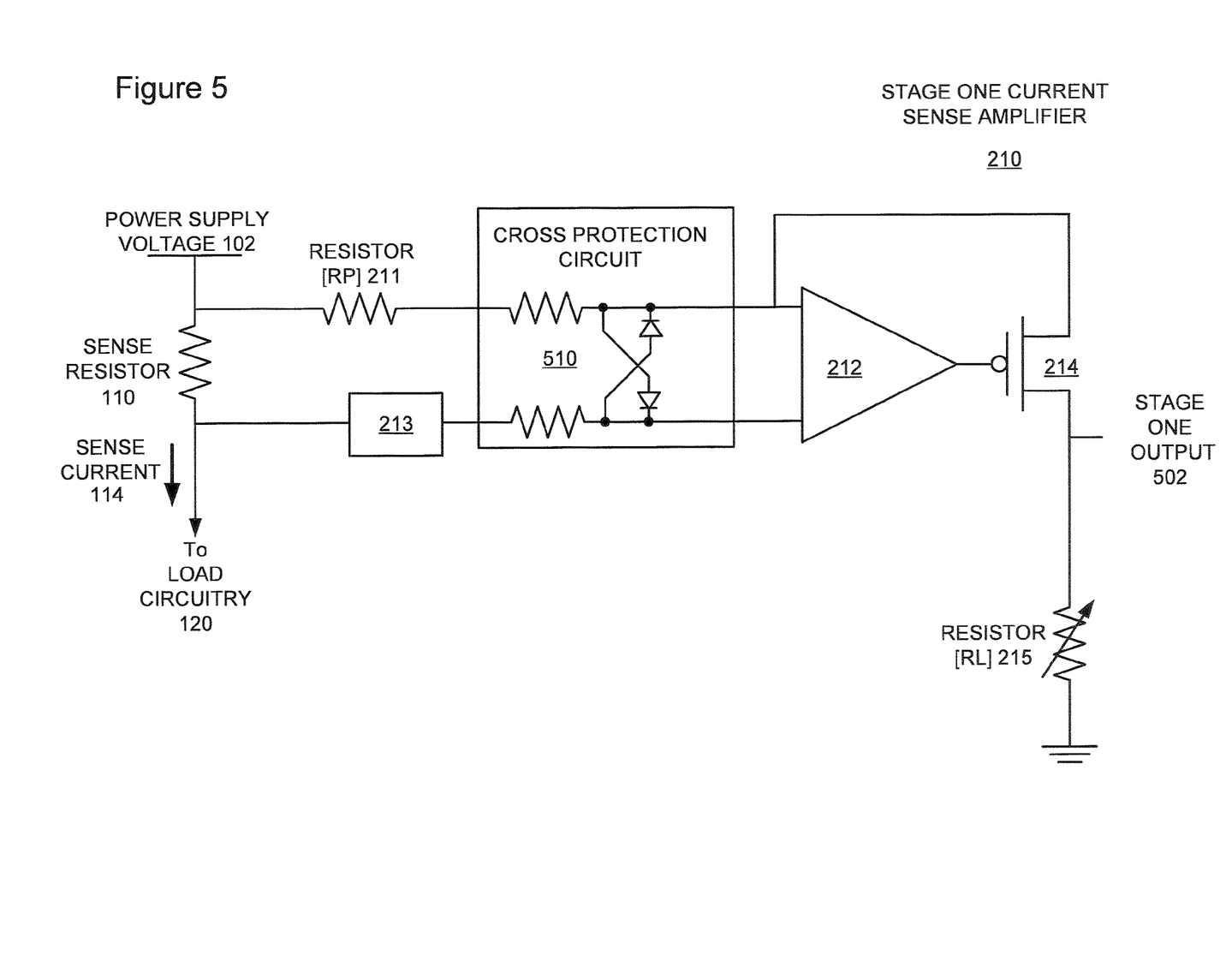
FIG. 5 is a block diagram of an example reconfigurable current sense amplifier with a cross protection circuit according to embodiments of the invention.

FIG. 5 is a block diagram of an example reconfigurable current sense amplifier 200 with a cross protection circuit 510 according to embodiments of the invention. Referring to FIG. 5, the reconfigurable current sense amplifier 200 includes a cross protection circuit 510 to help ensure a voltage difference received by the operational amplifier 212 at its two input terminals does not exceed a predetermined level.

The cross protection circuit 510 can include resistors coupled in series with the two input lines coupling to the input terminals of the operational amplifier 212. The cross protection circuit 510 can also include diodes that cross-connect between the two input lines. During normal operation the diodes remain inactive, i.e., do not pass current or voltage to the other input line that is sufficient enough to effect operation. When the voltage difference between the two input lines exceeds a predetermined level, at least one of the diodes activates, to substantially equalize the voltage on the two input lines. The cross protection circuit 510 ensures that the voltage difference received by the operational amplifier 212 at its two input terminals is sufficiently large to affect the operation of the operational amplifier 212. Thus, the cross protection circuit 510 improves the robustness of the reconfigurable current sense amplifier 200 during its operational life.

Figure 6:
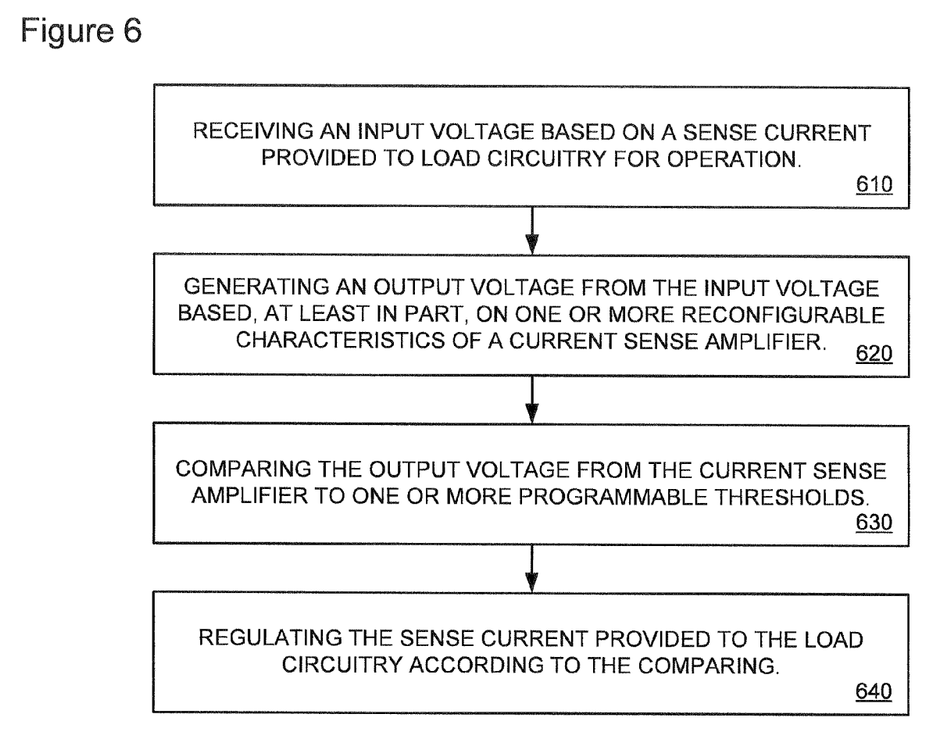
FIG. 6 is an example operational flowchart for the electronic system as shown in FIGS. 1-5.

FIG. 6 is an example operational flowchart for the electronic system 100 as shown in FIGS. 1-5. Referring to FIG. 6, at a block 610, the electronic system 100 receives an input voltage or sense voltage 112 based on a sense current 114 provided to load circuitry 120.

A sense resistor 110 can receive a power supply voltage 102 and induce the sense current 114 to be provided to the load circuitry 120. The electronic system 100 includes a current controller 130 to adjust the magnitude of the sense current 114 that is driven through a sense resistor 110. Thus, the combination of the sense resistor 110 and the current controller 130 can dictate the magnitude of the sense current 114 provided to the load circuitry 120.

The reconfigurable current sense amplifier 200 can detect the sense voltage 112 or input voltage across the sense resistor 110. The sense voltage 112 corresponds to the magnitude of sense current 114 generated by the current controller 130, the sense resistor 110, and the power supply voltage 102. In some embodiments, the reconfigurable current sense amplifier 200 can receive the sense voltage 112 as a pair of inputs, one corresponding to the node of the sense resistor 110 coupled to the power supply voltage 102 and the other corresponding to the node of the sense resistor 110 coupled to the load circuitry 120.

In a next block 620, the electronic system 100 generates an output voltage 205 from the input voltage 112 based, at least in part, on one or more reconfigurable characteristics of a current sense amplifier 200.

In some embodiments, the electronic system 100 can set an adjustable gain associated with the current sense amplifier 200, and amplify the input voltage 112 according to the adjustable gain to generate the output voltage 205. The electronic system 100 can also set an input voltage offset associated with the current sense amplifier, and amplify the input voltage according to the input voltage offset to generate the output voltage.

In the next blocks 630 and 640, the electronic system 100 compares the output voltage 205 from the reconfigurable current sense amplifier 200 to one or more programmable thresholds, and regulates the sense current 114 provided to the load circuitry 120 according to the comparing.

In some embodiments, the electronic system 100 can dictate an operational frequency associated with the sense current 114 based, at least in part, on an upper threshold and a lower threshold. For instance, the microcontroller 140 can compare the output voltage 205 to the upper threshold, and can cease driving the sense current 114 through the load circuitry 140 when the output voltage 205 meets or exceeds the upper threshold. In some embodiments, the microcontroller 140 can prompt the current controller 130 to deactivate, and thus cease driving the sense current 114.

The microcontroller 140 can also compare the output voltage 205 to the lower threshold, and can drive the sense current 114 through the load circuitry 140 when the output voltage 205 meets or exceeds the lower threshold. In some embodiments, the microcontroller 140 can prompt the current controller 130 to activate, and thus drive the sense current 114. The switching between the activation and deactivation of the current controller 130 over time can cause the sense current 114, the sense voltage 112, and the output voltage 205 to oscillate, defining the operating frequency of the electronic system 100.

One of skill in the art will recognize that the concepts taught herein can be tailored to a particular application in many other advantageous ways. In particular, those skilled in the art will recognize that the illustrated embodiments are but one of many alternative implementations that will become apparent upon reading this disclosure.

The preceding embodiments are exemplary. Although the specification may refer to "an", "one", "another", or "some" embodiment(s) in several locations, this does not necessarily mean that each such reference is to the same embodiment(s), or that the feature only applies to a single embodiment.

What is claimed is:

1. A system comprising:
   a current sense amplifier configured to receive an input voltage based on a sense current provided to load circuitry, and configured to generate an output voltage from the input voltage based, at least in part, on one or more reconfigurable characteristics of the current sense amplifier; and
   a microcontroller configured to compare the output voltage from the current sense amplifier to one or more programmable thresholds, wherein the microcontroller is configured to direct a current controller to regulate the sense current provided to the load circuitry according to the comparison, and is further configured to set an adjustable gain associated with the current sense amplifier.

2. The system of claim 1, wherein the current sense amplifier is configured to generate the output voltage by amplifying the input voltage according to the adjustable gain.

3. The system of claim 1, wherein the microcontroller is configured to set an input voltage offset associated with the current sense amplifier, and wherein the current sense amplifier is configured to generate the output voltage by amplifying the input voltage according to the input voltage offset.

4. The system of claim 1, wherein the microcontroller includes an upper threshold and a lower threshold that, at least in part, dictate an operational frequency associated with the sense current.

5. The system of claim 4, wherein the microcontroller is configured to compare the output voltage to the upper threshold and directs the current controller to cease driving the sense current when the output voltage meets or exceeds the upper threshold.

6. The system of claim 4, wherein the microcontroller is configured to compare the output voltage to the lower threshold and directs the current controller to initiate driving the sense current when the output voltage meets or exceeds the lower threshold.

7. The system of claim 1, further comprising a high-side sense resistor coupled in series with the load circuitry, wherein the voltage difference across the high-side sense resistor is the input voltage.

8. A method comprising:
receiving an input voltage based on a sense current provided to load circuitry;
generating an output voltage from the input voltage based, at least in part, on one or more reconfigurable characteristics of a current sense amplifier;
comparing the output voltage from the current sense amplifier to one or more programmable thresholds;
setting an adjustable gain associated with the current sense amplifier; and
regulating the sense current provided to the load circuitry according to the comparing.

9. The method of claim 8, further comprising:
amplifying the input voltage according to the adjustable gain to generate the output voltage.

10. The method of claim 8, further comprising:
setting an input voltage offset associated with the current sense amplifier; and
amplifying the input voltage according to the input voltage offset to generate the output voltage.

11. The method of claim 8, further comprising dictating an operational frequency associated with the sense current based, at least in part, on an upper threshold and a lower threshold.

12. The method of claim 9, further comprising:
comparing the output voltage to the upper threshold; and
ceasing to drive the sense current through the load circuitry when the output voltage meets or exceeds the upper threshold.

13. The method of claim 9, further comprising:
comparing the output voltage to the lower threshold; and
driving the sense current through the load circuitry when the output voltage meets or exceeds the lower threshold.

14. An apparatus comprising:
a first amplification circuit to receive an input voltage that corresponds to a current flowing through a sense resistor to load circuitry, the first amplification circuit to amplify the input voltage according to one or more adjustable characteristics that are configurable by a microcontroller; and
a second amplification circuit to generate an output voltage by amplifying the input voltage from the first amplification circuit according to one or more adjustable characteristics that are configurable by the microcontroller, wherein the microcontroller utilizes the output voltage to regulate current provided to the load circuitry.

15. The apparatus of claim 14, wherein the first amplification circuit includes at least one of an adjustable gain characteristic or an adjustable input offset characteristic, and wherein the first amplification circuit is configured to amplify the input voltage according to at least one of the adjustable gain characteristic or the adjustable input offset characteristic as configured by the microcontroller.

16. The apparatus of claim 14, wherein the second amplification circuit includes at least one of an adjustable gain characteristic or an adjustable input offset characteristic, and wherein the first amplification circuit is configured to amplify the input voltage according to at least one of the adjustable gain characteristic or the adjustable input offset characteristic as configured by the microcontroller.

17. The apparatus of claim 14, wherein the second amplification circuit includes a bandwidth adjustment device to dampen effects of power supply noise associated with the input voltage from propagating to the output voltage.

18. The apparatus of claim 14, further comprising bypass circuitry to provide the amplified input voltage from the first amplification circuit as the output voltage.

19. The apparatus of claim 14, wherein the first amplification circuit includes self-powering functionality by utilizing the voltage corresponding to one node coupled to the sense resistor as an elevated power supply, wherein the first amplification circuit includes a variable current source, a power resistor, and ground circuitry, to generate an elevate analog ground from the elevated power supply.

20. The apparatus of claim 14, wherein the first amplification circuit receives the input voltage on a pair of input lines, and wherein the first amplification circuit includes a cross protection circuit connected between the pair of input lines to ensure a voltage difference between the pair of input lines remains within a predetermined operational range of the first amplification circuit.

* * * * *